United States Patent
Zhang et al.

(10) Patent No.: US 9,939,248 B2
(45) Date of Patent: Apr. 10, 2018

(54) ALIGNMENT APPARATUS AND ALIGNMENT DETECTION METHOD

(71) Applicants: BOE Technology Group Co., Ltd., Beijiing (CN); Beijing BOE Display Technology Co., Ltd., Beijing (CN)

(72) Inventors: Ji Zhang, Beijing (CN); Zheng Bian, Beijing (CN); Shuai Xin, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/538,004

(22) PCT Filed: Feb. 1, 2016

(86) PCT No.: PCT/CN2016/073041
§ 371 (c)(1),
(2) Date: Jun. 20, 2017

(87) PCT Pub. No.: WO2017/049825
PCT Pub. Date: Mar. 30, 2017

(65) Prior Publication Data
US 2017/0370695 A1     Dec. 28, 2017

(30) Foreign Application Priority Data

Sep. 23, 2015   (CN) .......................... 2015 1 0615629

(51) Int. Cl.
*G01B 7/16*     (2006.01)
*G01B 7/31*     (2006.01)
*G08B 21/18*    (2006.01)

(52) U.S. Cl.
CPC ................ *G01B 7/31* (2013.01); *G01B 7/22* (2013.01); *G08B 21/182* (2013.01)

(58) Field of Classification Search
CPC ........ G01B 7/22; G01B 17/16; G08B 21/182; G08B 21/02; B25B 11/00; G02F 1/13; B23Q 3/18; B23Q 17/22
(Continued)

(56) References Cited

U.S. PATENT DOCUMENTS 6,151,967 A * 11/2000 McIntosh .............. B81B 3/0086
                                                        361/283.4
7,808,259 B2    10/2010 Eldridge et al.
(Continued)

FOREIGN PATENT DOCUMENTS

CN     101861644 A     10/2010
CN     201654182 U     11/2010
(Continued)

OTHER PUBLICATIONS

First Office Action from Chinese Patent Application No. 201510615629.1, dated Jan. 26, 2017, 14 pages.
(Continued)

*Primary Examiner* — Hung T Nguyen
(74) *Attorney, Agent, or Firm* — Westman, Champlin & Keohler, P.A.

(57) ABSTRACT

An alignment apparatus and an alignment detection method, which fall within a field of display technology, are disclosed herein. The alignment apparatus includes: a work table; a plurality of alignment rods provided on the work table, wherein a capacitor element is provided inside the alignment rod, and a capacitance of the capacitor element is changeable as the alignment rod deforms; and an alarm element connected to the capacitor element for giving an alarm when it receives a capacitance change value which exceeds a preset threshold value.

12 Claims, 4 Drawing Sheets

(58) Field of Classification Search
USPC .... 340/545.4, 562, 611, 614, 626, 657, 665, 340/686.2, 686.5, 954
See application file for complete search history.

(56) References Cited

U.S. PATENT DOCUMENTS

| | | | |
|---|---|---|---|
| 9,245,786 B2 | 1/2016 | Koelmel et al. | |
| 2012/0158355 A1 | 6/2012 | Matsumoto et al. | |
| 2014/0218061 A1 | 8/2014 | Detofsky et al. | |
| 2015/0155095 A1* | 6/2015 | Wu .................. | H02J 17/00 307/104 |

FOREIGN PATENT DOCUMENTS

| CN | 202003973 U | 10/2011 |
|---|---|---|
| CN | 203149245 U | 8/2013 |
| CN | 203218231 U | 9/2013 |
| CN | 203311119 U | 11/2013 |
| CN | 103534799 A | 1/2014 |
| CN | 203465489 U | 3/2014 |
| CN | 203509990 U | 4/2014 |
| CN | 104063992 A | 9/2014 |
| CN | 105215760 A | 1/2016 |
| JP | 2013-105752 A | 5/2013 |
| WO | 2014/057843 A1 | 4/2014 |

OTHER PUBLICATIONS

Second Office Action from Chinese Patent Application No. 201510615629.1, dated Jul. 10, 2017, 15 pages.

International Search Report and Written Opinion, including English translation of Box No. V of the Written Opinion, for International Application No. PCT/CN2016/073041, dated Mar. 31, 2016, 9 pages.

English translation of International Search Report and Written Opinion for International Application No. PCT/CN2016/073041, dated Mar. 31, 2016, 9 pages.

* cited by examiner

ALIGNMENT APPARATUS AND ALIGNMENT DETECTION METHOD

CROSS-REFERENCE TO RELATED APPLICATION

This application is a Section 371 National Stage Application of International Application No. PCT/CN2016/073041, filed on Feb. 1, 2016, entitled "ALIGNMENT APPARATUS AND ALIGNMENT DETECTION METHOD", which claims priority to Chinese Patent Application No. 201510615629.1, filed on Sep. 23, 2015 with SIPO, incorporated herein by reference in their entirety.

BACKGROUND

Technical Field

Embodiments of the present disclosure relate to a field of display technology, and more particularly, to an alignment apparatus and an alignment detection method.

Description of the Related Art

In a manufacturing process of a liquid crystal display (LCD), an organic light emitting diode (OLED) display, or the like, there are a large number of steps for processing (for example, photoetching, sticking film, cutting, etc.) a glass substrate (for example, an array substrate, a color filter substrate, etc.). In order to ensure processing precision, the substrate is firstly aligned before each processing step.

However, there are at least the following issues in the related art: an alignment element is typically made of hard PEK (polyether ketone), which is a rigid material. If the substrate is placed by the robot arm with a position error, a relatively larger impact force will be applied to the substrate at the moment that the alignment element is made contact with the substrate. It will tend to damage the substrate, especially for substrates with a lower thickness (for example, less than or equal to 0.5 mm), therefore the substrate alignment apparatuses in the related art are generally not available for the substrates with a lower thickness. Furthermore, at present, a vacuum system on the work table is mainly used for making a warning that an alignment error occurs. Specifically, when the substrate is placed on the work table, a warning is issued based on whether a value of vacuum by means of which the substrate is absorbed by the work table reaches a standard value. However, in practical applications, there are some issues, for example, it is difficult to control the time when a vacuum suction cooperates with the robot arm, or the vacuum value is so large as to cause the alignment invalid, thereby incurring too much false alarms and further affecting practical production.

SUMMARY

In one aspect, there is provided an alignment apparatus, comprising:
a work table;
a plurality of alignment rods provided on the work table, wherein a capacitor element is provided inside the alignment rod, and a capacitance of the capacitor element is changeable as the alignment rod deforms; and
an alarm element connected to the capacitor element for giving an alarm when it receives a capacitance change value which exceeds a preset threshold value.

Further, the alignment apparatus further comprises a gain element connected to the capacitor element for amplifying or reducing the capacitance change value of the capacitor element and sending the amplified or reduced capacitance change value to the alarm element, wherein the alarm element is configured for giving the alarm when it receives a capacitance change value from the gain element which exceeds the preset threshold value.

Further, the gain element comprises a slide rheostat, a first resistor, a transistor, a second resistor and a third resistor connected to the capacitor element; one end of the slide rheostat is connected to the capacitor element and the other end is connected to a low level; one end of the first resistor is connected to a high level and the other end of the first resistor is connected to the capacitor element; one end of the second resistor is connected to the high level and the other end of the second resistor is connected to a collector of the transistor; one end of the third resistor is connected to the collector of the transistor and the other end of the third resistor is connected to the low level; a base of the transistor is connected to the capacitor element, and the collector is connected to the second resistor and the third resistor respectively, and an emitter of the transistor is connected to the low level.

Further, the alignment apparatus further comprises a voltage transformation circuit and an alternating current-to-direct current converter circuit connected to the capacitor element, wherein the voltage transformation circuit is configured for transforming a voltage of an electric signal applied to the capacitor element, and the alternating current-to-direct current converter circuit is configured for converting the electric signal applied to the capacitor element from an alternating current to a direct current.

Further, the alignment rod comprises a housing and the capacitor element provided in the housing, the housing being made of soft rubber.

Further, the housing comprises a first portion and a second portion cooperating with the first portion, the first portion is of a cylindrical structure, an end face of the cylindrical structure is recessed inwardly to form a groove, and the second portion comprises a base portion fixed to the work table and a projection provided on the base portion and cooperating with the groove; wherein the projection is located in the groove and a gap is formed between the projection and the groove when the first portion and the second portion cooperate with each other to form the housing.

Further, the capacitor element comprises an upper electrode plate and a lower electrode plate, the upper electrode plate being located in a bottom of the groove and the lower electrode plate being located on a top of the projection.

Further, the groove is a cylindrical groove, the projection is a cylindrical projection, the base portion is a circular base portion, and an outer diameter of the circular base portion is equal to an outer diameter of the cylindrical structure.

Further, the housing has a height in a range of 1 to 2 cm.

Further, the outer diameter of the cylindrical structure is in a range of 1 to 2 cm.

Further, the outer diameter of the cylindrical structure is 1.2 cm.

In the embodiments of the present disclosure, there is further provided an alignment detection method, comprising steps of:
placing a substrate to be aligned with a work table on the work table, wherein a plurality of alignment rods are provided on the work table, the alignment rods are respectively located at at least two opposite sides of the substrate, a capacitor element is provided inside the alignment rod, and a capacitance of the capacitor element is changeable as the alignment rod deforms;

detecting whether the capacitance of the capacitor element has changed or not, and giving an alarm when a capacitance change value of the capacitor element exceeds a preset threshold value.

DETAILED DESCRIPTION OF PREFERRED EMBODIMENTS

In order to make clear the technical problem to be solved, technical solutions and advantages of the embodiments of the present disclosure, the present disclosure will now be described in detail in connection with specific embodiments with reference to the accompanying drawings.

Figure 1:
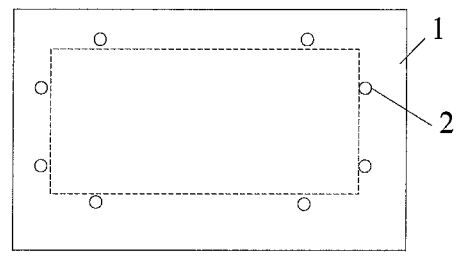
FIG. 1 is a schematic structural view of a substrate alignment apparatus.

As shown in FIG. 1, a substrate alignment apparatus includes a plurality of stoppers 2 provided on a work table 1 for aligning a substrate. When the substrate is to be aligned with the work table, the substrate is placed on the work table 1 by a robot arm, the plurality of stoppers 2 are located outside four sides of the substrate, respectively.

It is found that there are at least the following issues in the above substrate alignment apparatus: the stopper 2 is typically made of hard PEK (polyether ketone), which is a rigid material. If the substrate is placed by the robot arm with a position error, a relatively larger impact force will be applied to the substrate at the moment that the stopper is made contact with the substrate. It will tend to damage the substrate, especially for substrates with a lower thickness (for example, less than or equal to 0.5 mm), therefore the substrate alignment apparatuses are generally not available for the substrates with a lower thickness. Furthermore, at present, a vacuum system on the work table is mainly used for making a warning that an alignment error occurs. Specifically, when the substrate is placed on the work table, a warning is issued based on whether a value of vacuum by means of which the substrate is absorbed by the work table reaches a standard value. However, in practical applications, there are some issues, for example, it is difficult to control the time when a vacuum suction cooperates with the robot arm, or the vacuum value is so large as to cause the alignment invalid, thereby incurring too much false alarms and further affecting practical production.

The technical problem to be solved by the present disclosure is to provide an alignment apparatus and an alignment detection method, which can give an alarm for an alignment error and reduce a probability of false alarm. Specifically, in view of the issues that the substrate alignment apparatuses are generally not available for the substrate with a lower thickness, there are too much false alarms and they have affected practical production, the embodiments of the present disclosure provide an alignment apparatus, which can give an alarm for an alignment error and reduce a probability of false alarm.

Figure 2:
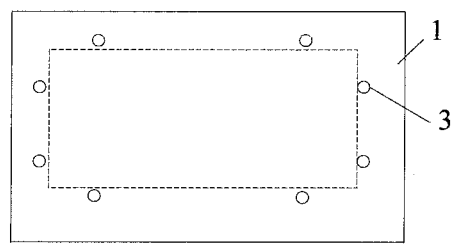
FIG. 2 is a schematic structural view of an alignment apparatus according to an embodiment of the present disclosure.
Figure 10:
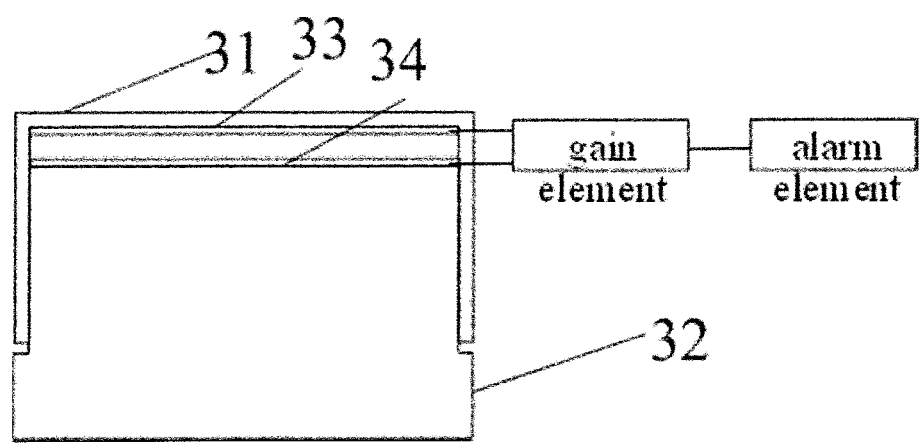
FIG. 10 is a schematic view showing a connection relationship between an alignment rod, a gain element and an alarm element in an alignment apparatus according to an embodiment of the present disclosure.

In an embodiment of the present disclosure, there is provided an alignment apparatus, as shown in FIG. 2, comprising:

a work table 1;

a plurality of alignment rods 3 provided on the work table, wherein a capacitor element is provided inside the alignment rod 3, and a capacitance of the capacitor element is changeable as the alignment rod 3 deforms; and an alarm element (as shown in FIG. 10) connected to the capacitor element for giving an alarm when it receives a capacitance change value which exceeds a preset threshold value.

In the embodiment, a plurality of alignment rods are provided on a work table, and a capacitor element is provided inside the alignment rod. If the substrate is placed by a robot arm with a position error, the alignment rod will deform when it is made contact with the substrate, then the capacitance of the capacitor element will accordingly change, and the alarm element will give an alarm according to the capacitance change value of the capacitor element. It is technically achievable to give an alarm by using a capacitor element, and it reduces cost for giving the alarm, has a relatively high alarm precision, and can greatly reduce a probability of false alarm.

Further, the alignment apparatus further comprises a gain element connected to the capacitor element for amplifying or reducing the capacitance change value of the capacitor element and sending the amplified or reduced capacitance change value to the alarm element, wherein the alarm element is configured for giving the alarm when it receives a capacitance change value from the gain element which exceeds the preset threshold value.

The gain element may amplify or reduce the capacitance change value of the capacitor element, and the alarm element may give the alarm according to the capacitance change value sent from the gain element. Thus, if an alarm threshold value of the alarm element is constant, an alarm precision may be changed by adjusting the gain element according to the real requirement. If a relatively high alarm precision is desired, the gain element may be set to reduce the capacitance change value of the capacitor element; if a relatively low alarm precision is desired, the gain element may be set to amplify the capacitance change value of the capacitor element. It allows the sensitivity of the capacitor element to be controllable, allows the amplitude of the output signal to be controllable, and has a high flexibility.

Figure 5:
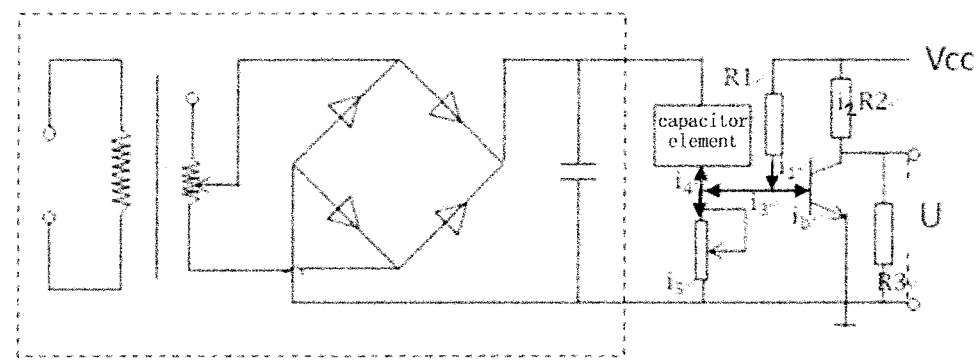
FIG. 5 is a circuit configuration diagram of an alignment apparatus according to an embodiment of the present disclosure.

Specifically, a realizing circuit of the alignment apparatus is shown in FIG. 5, in which the portion in a dashed block represents a voltage transformation circuit and an AC (alternating current)-to-DC (direct current) converter circuit connected to the capacitor element. The voltage transformation circuit is configured for transforming a voltage of an electric signal applied to the capacitor element, and the AC-to-DC converter circuit is configured for converting the electric signal applied to the capacitor element from an alternating current to a direct current. As shown in FIG. 5, the gain element includes a slide rheostat, a first resistor R1, a transistor, a second resistor R2 and a third resistor R3 connected to the capacitor element; one end of the slide rheostat is connected to the capacitor element and the other end is connected to a low level; one end of the first resistor R1 is connected to a high level and the other end is connected to the capacitor element; one end of the second resistor R2 is connected to the high level and the other end is connected to a collector of the transistor; one end of the third resistor R3 is connected to the collector of the transistor and the other end is connected to the low level; a base of the transistor is connected to the capacitor element, and the collector is connected to the second resistor R2 and the third resistor R3 respectively, and an emitter of the transistor is connected to the low level. When the alignment rod is forced to deform, a current $i_4$ is generated. Since $i_5$ is constant, $i_3$ increases. Moreover, since $i_1$ is constant and $i_b$ decreases, and $i_2=\beta \cdot i_b$ and an output voltage $U=V_{CC}-i_2 \cdot R2$, the deformation of the alignment rod may affect the output. Thus, it is possible to determine whether the alignment rod has deformed, by means of detecting the output. If the detection precision needs to be changed, the slide rheostat may be adjusted so as to change $i_5$. Since $i_b=i_1-i_3=i_1-(i_5+i_4)$, the output may be affected, thereby changing the detection precision.

Specifically, the alignment rod includes a housing made of soft rubber, and the capacitor element is provided in the housing, the housing adopts soft rubber material. In this way, the stress applied to the substrate due to the strike of the substrate onto the alignment rod in the case of having the positioning error may be reduced, thereby reducing the damage to the substrate and reducing a yield of poor substrates. In addition, the housing is made of rubber so that the deformation is relatively larger when a force is applied, thus in the case that the substrate is placed by a robot arm with a position error, the wear of the alignment rod is relatively small when the substrate is made contact with the alignment rod, thereby improving service life of the alignment rod.

Figure 3:
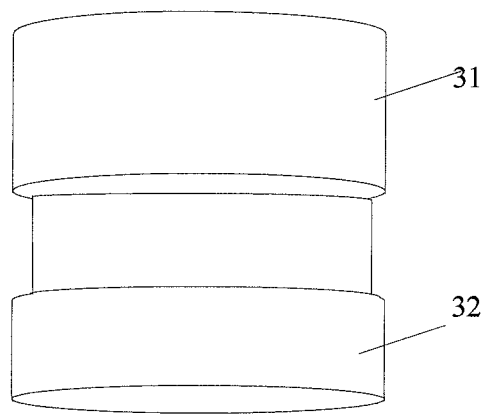
FIG. 3 is an exploded view of an alignment rod according to an embodiment of the present disclosure.
Figure 4A:
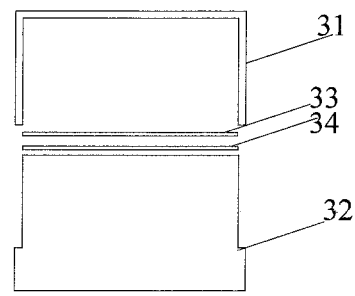
FIG. 4a is a schematic cross-sectional view of the alignment rod in FIG. 3.
Figure 4B:
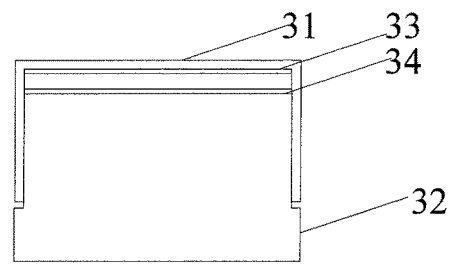
FIG. 4b is a schematic cross-sectional view of the alignment rod in FIG. 3 in an assembling state.

Further, as shown in FIGS. 3 and 4a-4b, the housing includes a first portion 31 and a second portion 32 cooperating with the first portion 31. The first portion 31 is of a cylindrical structure, an end face of the cylindrical structure is recessed inwardly to form a groove, and the second portion 32 includes a base portion fixed to the work table and a projection provided on the base portion and cooperating with the groove. The projection is located in the groove and a gap is formed between the projection and the groove when the first portion 31 and the second portion 32 cooperate with each other to form the housing. The capacitor element may be arranged in the gap formed between the projection and the groove. Specifically, the capacitor element may consist of an upper electrode plate 33 and a lower electrode plate 34, in which electrical charges are pre-stored. As shown in FIG. 4, the upper electrode plate of the capacitor element may be located in a bottom of the groove and the lower electrode plate of the capacitor element may be located on a top of the projection. When the alignment rod deforms, the capacitance of the capacitor element accordingly changes, then the alarm element gives an alarm according to the capacitance change value of the capacitor element. In particular, the alarm element may give an audible alarm when the capacitance change value of the capacitor element exceeds the preset threshold value, so as to prompt an operator that the substrate is incorrectly placed.

In this embodiment, the alignment rod is of a combined structure, thus, the damage may be generally made to the first portion, and the first portion may be easily replaced. Therefore, it is unnecessary to replace the whole structure, thereby reducing replacement cost.

Specifically, the groove may be a cylindrical groove, the projection may be a cylindrical projection, the base portion may be a circular base portion, and an outer diameter of the circular base portion is equal to an outer diameter of the cylindrical structure of the first portion 31. Thus, when the first portion is assembled with the second portion, the alignment rod acts or looks like a solid rubber structure, without affecting the normal alignment function.

Optionally, the housing has a height in a range of 1 to 2 cm. If the housing is constructed in such a height, the alignment rod may effectively align the substrate, without affecting the operation of the robot arm.

Optionally, the outer diameter of the cylindrical structure is in a range of 1 to 2 cm. If the outer diameter of the cylindrical structure is in a range of 1 to 2 cm, the alignment rod may effectively align the substrate, without affecting the operation of the robot arm. Since the first portion of the alignment rod is relatively thinner, the outer diameter of the cylindrical structure is approximately equal to the diameter of the upper electrode plate or the lower electrode plate of the capacitor element.

According to an embodiment of the present disclosure, there is provided an alignment system, including a substrate to be aligned and the alignment apparatus as described above. When the substrate is aligning, the alignment rods are respectively located at at least two opposite sides of the substrate. Further, there are a plurality of alignment rods at each side of the substrate. In this way, it can prevent the substrate from deflecting. Moreover, in view of implementation cost, there are optionally two alignment rods at each side of the substrate, because more alignment rods will cause a higher cost of the alignment system.

In the embodiment, a plurality of alignment rods are provided on a work table, and a capacitor element is provided inside the alignment rod. The substrate is firstly placed on the work table by a robot arm so as to be aligned with the work table, if the placement position is incorrect, the alignment rod will deform when it is made contact with the substrate, then the capacitance of the capacitor element will accordingly change, and the alarm element will give an alarm according to the capacitance change value of the capacitor element. It is technically achievable to give an alarm by using a capacitor element, and it reduces cost for giving the alarm, has a relatively high alarm precision, and can greatly reduce probability of false alarm.

In an embodiment of the present disclosure, there is provided an alignment apparatus, as shown in FIG. 2, including:

a work table 1;

a plurality of alignment rods 3 provided on the work table, wherein a capacitor element is provided inside the alignment rod 3, and a capacitance of the capacitor element is changeable as the alignment rod 3 deforms; and an alarm element connected to the capacitor element, wherein the alarm element may give an audible alarm when a capacitance change value of the capacitor element exceeds a preset threshold value, so as to prompt an operator that the substrate is incorrectly placed.

The alignment rod includes a housing made of soft rubber, and the capacitor element is provided in the housing, the housing is of a combined structure, including a first portion 31 and a second portion 32 cooperating with the first portion. The first portion 31 is of a cylindrical structure, an end face of the cylindrical structure is recessed inwardly to form a groove, and the second portion 32 includes a base portion fixed to the work table and a projection provided on the base portion and cooperating with the groove. The projection is located in the groove and a gap is formed between the projection and the groove when the first portion 31 and the second portion 32 cooperate with each other to form the housing. The capacitor element is arranged in the gap formed between the projection and the groove. The capacitor element consists of an upper electrode plate and a lower electrode plate, in which electrical charges are pre-stored. As shown in FIG. 4, the upper electrode plate of the capacitor element is located in a bottom of the groove and the lower electrode plate of the capacitor element is located on a top of the projection.

In this embodiment, the groove of a cylindrical structure in the alignment rod is a cylindrical groove, the diameter of the upper electrode plate is equal to the diameter of the lower electrode plate of the capacitor element, and the diameter of the upper electrode plate of the capacitor element is equal to the outer diameter of the cylindrical groove, the outer diameter of the cylindrical structure of the alignment rod is 1.2 cm. Since the first portion of the alignment rod is relatively thinner, the outer diameter of the cylindrical structure is approximately equal to the diameter of the upper electrode plate or the lower electrode plate of the capacitor element. Thus, the diameter of the upper electrode plate or the lower electrode plate of the capacitor element may also be 1.2 cm.

Figure 6:
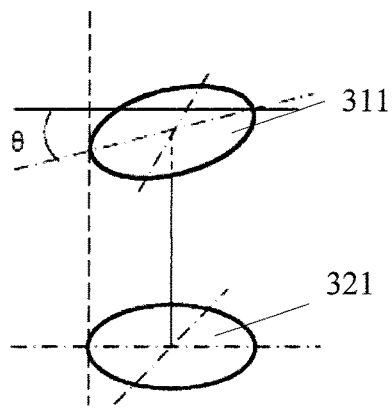
FIG. 6 is a schematic view of an alignment rod according to an embodiment of the present disclosure in a deformation state.
Figure 7:
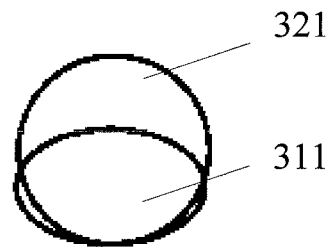
FIG. 7 is a schematic top view of an alignment rod according to an embodiment of the present disclosure in a deformation state.
Figure 8:
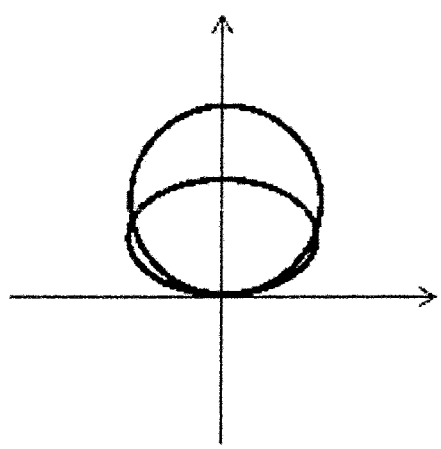
FIG. 8 is a schematic top view in a coordinate system of an alignment rod according to an embodiment of the present disclosure in a deformation state.

As shown in FIGS. 6 and 7, when the substrate is placed by the robot arm with a position error or deviation, the substrate will be made contact with the alignment rod, the alignment rod will deform, then an upper surface 311 of the first portion will be pressed so that it presents an oval shape, but a lower surface 321 of the second portion remains a circular shape. When the deformation occurs, the upper electrode plate of the capacitor element deflects downwardly by an angle θ. Providing that left sides of the upper electrode plate and the lower electrode plate of the capacitor element are aligned with each other, and an original distance between the upper electrode plate and the lower electrode plate is d, and a dielectric coefficient of vacuum and a dielectric coefficient of air are respectively $\epsilon$, $\epsilon_o$, and the diameter of the upper electrode plate or the lower electrode plate of the capacitor element is approximately 1.2 cm, a coordinate system as shown in FIG. 8 may be established, and the equations may be obtained as follows:

$$\begin{cases} x^2 + (y - 0.6)^2 = 0.6^2 \\ \dfrac{x^2}{0.6^2} + \dfrac{(y - 0.6\cos\theta)^2}{(0.6\cos\theta)^2} = 1 \end{cases}$$

where (x, y) represents coordinate values of a point in an outer periphery of the lower surface 321 in this coordinate system, or coordinate values of a point in an outer periphery of the upper surface 311 in this coordinate system.

Their solutions are as follows, $$\begin{cases} x = \pm \dfrac{2\sqrt{0.6\cos\theta}}{1 + \cos\theta} \\ y = \dfrac{1.2\cos\theta^2}{1 + \cos\theta} \end{cases}$$

where the obtained (x, y) represents coordinate values of an intersection point of the outer periphery of the lower surface 321 and the outer periphery of the upper surface 311.

Figure 9:
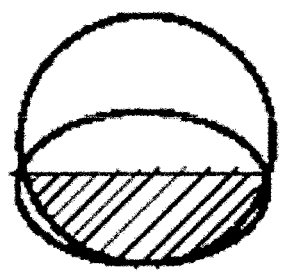
FIG. 9 is a schematic view showing an irregular area for calculating an effective capacitance according to an embodiment of the present disclosure.

As shown in FIG. 9, as for the capacitor element of an irregular shape, an area for an effective capacitance may include two portions in terms of calculation, a shaded portion and a non-shaded portion, the shaded portion may be calculated according to a circle and the non-shaded portion may be calculated according to an oval.

(1) As for the Circular Portion

The coordinate axes are changed, and the coordinate origin is set to be the center of the circle, and a straight line perpendicular to the plane of the circle is Z axis, then it can be obtained that the capacitance of the circular portion is:

$$\int_{\frac{0.6(1-\cos\theta)}{1+\cos\theta}}^{0.6} \dfrac{2\varepsilon\varepsilon_o \sqrt{0.6^2 - y^2}}{\tan\theta y + d - 1.2\sin\theta + 0.6\tan\theta} dy$$

(2) As for the Oval Portion the coordinate origin of the horizontal coordinate system is set to be the center of the oval, and a straight line perpendicular to the plane of the circle is Z axis, then it can be obtained that the capacitance of the oval portion is:

$$\int_{\frac{0.006\cos\theta(1-\cos\theta)}{1+\cos\theta}}^{0.006\cos\theta} \dfrac{2\varepsilon\varepsilon_o \sqrt{0.006^2 - \dfrac{y^2}{\cos^2\theta}}}{\tan\theta y + d - 0.006\sin\theta} dy$$

In summary, after the alignment rod deforms, the capacitance C of the capacitor element becomes:

$$\int_{\frac{0.6(1-\cos\theta)}{1+\cos\theta}}^{0.6} \dfrac{2\varepsilon\varepsilon_o \sqrt{0.6^2 - y^2}}{\tan\theta y + d - 1.2\sin\theta + 0.6\tan\theta} dy +$$

$$\int_{\frac{0.006\cos\theta(1-\cos\theta)}{1+\cos\theta}}^{0.006\cos\theta} \dfrac{2\varepsilon\varepsilon_o \sqrt{0.006^2 - \dfrac{y^2}{\cos^2\theta}}}{\tan\theta y + d - 0.006\sin\theta} dy$$

The capacitance value in a normal state of the alignment rod is:

$$C_o = \dfrac{0.006^2 \pi \varepsilon \varepsilon_o}{d}$$

Then, after the alignment rod deforms, a capacitive reactance change value ΔR of the capacitor element is:

$$\Delta R = \frac{1}{2\pi f C_o} - \frac{1}{2\pi f C} \quad \text{①}$$

$$\frac{1}{\Delta C} = \frac{1}{C_o} - \frac{1}{C}$$

where f represents frequency.

The most common ampere meter available in the market can measure a change of current I of 0.1 A. If such an ampere meter is used to measure the capacitance change value, and the voltage U applied to the capacitor element is 12V and a moving velocity V of the substrate by the robot arm is approximately 80 cm/s, and in accordance with the following equation:

$$I = \frac{\Delta Q}{\Delta t}$$

Then, it can be obtained that a change value of a quantity of electric charge is approximately:

$$\Delta Q = 5.40288 \times 10^{-5} C$$

where Δt is a time in which the upper electrode plate of the capacitor element deforms, $$\Delta t = \frac{\text{a deformation amount of the upper electrode plate of the capacitor element}}{\text{a moving velocity } V \text{ of the substrate by the robot arm}}.$$

According to:

$$\Delta Q = U^*(\Delta C)$$

It can be obtained that the capacitance change value which can be measured and recognized by the ampere meter is:

$$\Delta C = U/\Delta Q \quad \text{②}$$

The capacitance change value which can be measured and recognized by the ampere meter changes as the voltage applied to the capacitor element changes. Solving the equations ① and ②, it can be known that the ampere meter can at least recognize a change of an angle θ of 1° when a voltage of approximately 30V is applied at two sides of the capacitor element.

In the embodiment, a plurality of alignment rods are provided on a work table, and a capacitor element is provided inside the alignment rod. If the substrate is placed by a robot arm with a position error, the alignment rod will deform when it is made contact with the substrate, then the capacitance of the capacitor element will accordingly change, and the alarm element will give an alarm according to the capacitance change value of the capacitor element. It is technically achievable to give an alarm by using a capacitor element, and it reduces cost for giving the alarm, has a relatively high alarm precision, and can greatly reduce a probability of false alarm.

According to an embodiment of the present disclosure, there is further provided an alignment detection method using the above-described alignment apparatus, including steps of:

placing a substrate to be aligned with a work table on the work table, wherein a plurality of alignment rods are provided on the work table, the alignment rods are respectively located at at least two opposite sides of the substrate, a capacitor element is provided inside the alignment rod, and a capacitance of the capacitor element is changeable as the alignment rod deforms;

detecting whether or not the capacitance of the capacitor element has changed, and giving an alarm when a capacitance change value of the capacitor element exceeds a preset threshold value.

In the embodiment, a plurality of alignment rods are provided on a work table, and a capacitor element is provided inside the alignment rod. If the substrate is placed by a robot arm with a position error, the alignment rod will deform when it is made contact with the substrate, then the capacitance of the capacitor element will accordingly change, and the alarm element will give an alarm according to the capacitance change value of the capacitor element. It is technically achievable to give an alarm by using a capacitor element, and it reduces cost for giving the alarm, has a relatively high alarm precision, and can greatly reduce a probability of false alarm.

The above embodiments are exemplary, and some modifications and improvements may be made to the present disclosure by those skilled in the art without departing from the principle of the present disclosure, such modifications and improvements belong to the scope of the present disclosure.

What is claimed is:

1. An alignment apparatus, comprising:
a work table;
a plurality of alignment rods provided on the work table, wherein a capacitor element is provided inside the alignment rod, and a capacitance of the capacitor element is changeable as the alignment rod deforms; and
an alarm element connected to the capacitor element for giving an alarm when it receives a capacitance change value which exceeds a preset threshold value.

2. The alignment apparatus according to claim 1, further comprising a gain element connected to the capacitor element for amplifying or reducing the capacitance change value of the capacitor element and sending the amplified or reduced capacitance change value to the alarm element,
wherein the alarm element is configured for giving the alarm when it receives a capacitance change value from the gain element which exceeds the preset threshold value.

3. The alignment apparatus according to claim 2, wherein the gain element comprises a slide rheostat, a first resistor, a transistor, a second resistor and a third resistor connected to the capacitor element; one end of the slide rheostat is connected to the capacitor element and another end is connected to a low level; one end of the first resistor is connected to a high level and another end of the first resistor is connected to the capacitor element; one end of the second resistor is connected to the high level and another end of the second resistor is connected to a collector of the transistor; one end of the third resistor is connected to the collector of the transistor and another end of the third resistor is connected to the low level; a base of the transistor is connected to the capacitor element, and the collector is connected to the second resistor and the third resistor respectively, and an emitter of the transistor is connected to the low level.

4. The alignment apparatus according to claim 3, further comprising a voltage transformation circuit and an alternating current-to-direct current converter circuit connected to the capacitor element, wherein the voltage transformation circuit is configured for transforming a voltage of an electric signal applied to the capacitor element, and the alternating current-to-direct current converter circuit is configured for converting the electric signal applied to the capacitor element from an alternating current to a direct current.

5. The alignment apparatus according to claim 1, wherein the alignment rod comprises a housing and the capacitor element provided in the housing, the housing being made of soft rubber.

6. The alignment apparatus according to claim 5, wherein the housing comprises a first portion and a second portion cooperating with the first portion, the first portion is of a cylindrical structure, an end face of the cylindrical structure is recessed inwardly to form a groove, and the second portion comprises a base portion fixed to the work table and a projection provided on the base portion and cooperating with the groove;
wherein the projection is located in the groove and a gap is formed between the projection and the groove when the first portion and the second portion cooperate with each other to form the housing.

7. The alignment apparatus according to claim 6, wherein the capacitor element comprises an upper electrode plate and a lower electrode plate, the upper electrode plate being located in a bottom of the groove and the lower electrode plate being located on a top of the projection.

8. The alignment apparatus according to claim 6, wherein the groove is a cylindrical groove, the projection is a cylindrical projection, the base portion is a circular base portion, and an outer diameter of the circular base portion is equal to an outer diameter of the cylindrical structure.

9. The alignment apparatus according to claim 5, wherein the housing has a height in a range of 1 to 2 cm.

10. The alignment apparatus according to claim 6, wherein the outer diameter of the cylindrical structure is in a range of 1 to 2 cm.

11. The alignment apparatus according to claim 10, wherein the outer diameter of the cylindrical structure is 1.2 cm.

12. An alignment detection method, comprising steps of:
placing a substrate to be aligned on the work table, wherein a plurality of alignment rods are provided on the work table, the alignment rods are respectively located at at least two opposite sides of the substrate, a capacitor element is provided inside the alignment rod, and a capacitance of the capacitor element is changeable as the alignment rod deforms;
detecting whether the capacitance of the capacitor element has changed or not, and giving an alarm when a capacitance change value of the capacitor element exceeds a preset threshold value.

\* \* \* \* \*